(12) United States Patent
Xue et al.

(10) Patent No.: US 7,254,032 B1
(45) Date of Patent: Aug. 7, 2007

(54) TECHNIQUES FOR PROVIDING EMI SHIELDING WITHIN A CIRCUIT BOARD COMPONENT

(75) Inventors: Jie Xue, Andover, MA (US); Zhiping Yang, Santa Clara, CA (US); Yida Zou, San Jose, CA (US)

(73) Assignee: Cisco Technology, Inc., San Jose, CA (US)

( * ) Notice: Subject to any disclaimer, the term of this patent is extended or adjusted under 35 U.S.C. 154(b) by 75 days.

(21) Appl. No.: 10/792,101

(22) Filed: Mar. 3, 2004

(51) Int. Cl.
*H05K 7/20* (2006.01)
*H01L 23/34* (2006.01)

(52) U.S. Cl. .................. 361/719; 361/718; 361/764; 257/707; 257/713

(58) Field of Classification Search ............. 361/704, 361/760, 762, 764, 717–719; 29/832; 257/777, 257/706, 707, 713, 721, 722
See application file for complete search history.

(56) References Cited

U.S. PATENT DOCUMENTS

| | | | | |
|---|---|---|---|---|
| 5,875,545 | A | 3/1999 | DiStefano et al. | 29/840 |
| 5,955,789 | A * | 9/1999 | Vendramin | 257/786 |
| 6,452,113 | B2 | 9/2002 | Dibene, II et al. | 174/260 |
| 6,714,416 | B1 | 3/2004 | McLeod et al. | 361/719 |
| 6,849,800 | B2 | 2/2005 | Mazurkiewicz | 174/35 MS |
| 2003/0122242 | A1 * | 7/2003 | Takeuchi | 257/697 |
| 2003/0174478 | A1 * | 9/2003 | Oggioni et al. | 361/760 |
| 2004/0150102 | A1 * | 8/2004 | Lee et al. | 257/723 |

OTHER PUBLICATIONS

Electromagnetic waves, The Hunchinson Encyclopedia, Helicon Publishing Limited, 2001., 1 page.*

* cited by examiner

*Primary Examiner*—Anatoly Vortman
(74) *Attorney, Agent, or Firm*—BainwoodHuang

(57) ABSTRACT

A circuit board component includes a substrate having non-conductive material and conductive material supported by the non-conductive material. The conductive material defines a circuit board interface, a die interface, a heat spreader interface, and (iv) a set of connections which interconnects the circuit board interface, the die interface and the heat spreader interface. The component further includes a die coupled to the die interface. The die includes integrated circuitry which is configured to electrically communicate with a circuit board when the circuit board couples to the circuit board interface. The component further includes a heat spreader coupled to the heat spreader interface. The heat spreader is configured to dissipate heat from the die. The heat spreader in combination with the heat spreader interface forms an electromagnetic interference shield when a portion of the circuit board interface connects to a ground reference of the circuit board.

21 Claims, 6 Drawing Sheets

TECHNIQUES FOR PROVIDING EMI SHIELDING WITHIN A CIRCUIT BOARD COMPONENT

BACKGROUND OF THE INVENTION

A typical Area Array Package (AAP) device such as a Ceramic Column Grid Array (CCGA) device or a Ball Grid Array (BGA) device includes a substrate, a die and a heat spreader. The substrate includes layers of non-conductive material and conductive material sandwiched together into a substantially plane-shaped element which supports (i) an array of circuit board contacts on one side (e.g., columns, balls, etc.) for connecting to a circuit board, and (ii) die contacts on the other side for connecting to the die. The die is a silicon-based chip containing integrated circuitry which generates heat during operation. The heat spreader (or lid) typically glues to the side of the substrate having the die contacts (e.g., using a thermal adhesive) and extends over the die to physically protect the die. A thermally conductive but electrically non-conductive material (e.g., thermal grease) resides typically between the heat spreader and the die to convey heat from the die to the heat spreader during operation.

When a circuit board manufacturer assembles a circuit board module having the AAP device, the manufacturer first solders the AAP device to a circuit board so that the heat spreader faces away from the circuit board. The manufacturer then attaches a heat sink to the heat spreader using, for example, metallic clips. During operation of the AAP device, the heat spreader transfers heat from the die to the heat sink. The heat sink then dissipates that heat into the surrounding environment.

It should be understood that the external metallic clips, which hold the heat sink in place, electrically connect both the heat spreader of the AAP device and the heat sink to a ground reference of the circuit board (e.g., ground pads or ground vias disposed around the AAP device) to prevent the heat spreader and the heat sink from operating as an antenna due to capacitive coupling between the die and the heat spreader. Accordingly, during operation of the AAP device, the heat sink, the heat spreader and the external metallic clips operate as an electromagnetic interference (EMI) barrier to block EMI radiating from the die rather than a transmitter which distributes that EMI into the surrounding environment.

SUMMARY OF THE INVENTION

Unfortunately, there are deficiencies to the above-described approach to grounding the heat sink and the heat spreader using external metallic clips. For example, such clips typically require additional space around the device package. In particular, the clips consume circuit board space that could otherwise be used by other circuit board components. Furthermore, the clips require placement of grounding structures (e.g., ground pads, ground vias, etc.) around the mounting location of the device package to enable the clips to connect the heat sink and the heat spreader to a ground reference so that the heat sink and the heat spreader can operate as an EMI barrier. The dedication of such space for additional ground connections not only consumes circuit board real estate, but also hinders routing of signal traces to and from the mounting location. Accordingly, use of the metallic clips imposes significant restrictions in the area around the mounting location of the device package.

Additionally, the metallic clips are often difficult to remove due to their strength and rigidity. Accordingly, if the manufacturer needs to remove the clips (e.g., to replace a damaged heat sink, to more thoroughly inspect the AAP device, etc.), the manufacturer often must break the clips and, in the process, risk damaging the AAP device and/or fracturing the solder joints connecting the AAP device to the circuit board. As a result, in some situations, the use of external metallic clips creates more problems than it solves.

Furthermore, although the metallic clips are typically distributed around the AAP package (e.g., eight clips extending around the AAP package), the metallic clips typically do not do a thorough job as an EMI fence to shield neighboring components from EMI emanating from the die. In particular, gaps between the clips typically allow EMI to easily escape thus allowing the EMI to then interfere with signals in the vicinity of the AAP device as well as make it more difficult for the AAP device to pass Federal Communications Commission (FCC) regulations. Moreover, it will become more difficult to provide reliable thermal management and competent EMI control as the operating speeds and power consumption of circuit board devices increase over time.

In contrast to the above-described conventional approach to grounding both a heat sink and a heat spreader of a device through metallic clips which are external to the device, embodiments of the invention are directed to EMI shielding techniques which utilize conductive material which is disposed around a circuit board component die and within the component itself. Such conductive material in combination with a heat spreader of the component is capable of forming an EMI shield internally within the component when connected to a ground reference of a circuit board through an interface of the component itself to block EMI which radiates from the die during operation. Thus, there is no need for external metallic clips to ground a heat sink in order to make the heat sink operate as an EMI shield. Rather, the circuit board space around the device, which would otherwise be used by the external metallic clips, is now available for use by other circuit board structures (e.g., signal traces, other circuit board components, etc.).

One embodiment of the invention is directed to a circuit board component which includes a substrate having non-conductive material and conductive material supported by the non-conductive material. The conductive material defines (i) a circuit board interface, (ii) a die interface, (iii) a heat spreader interface, and (iv) a set of connections which interconnects the circuit board interface, the die interface and the heat spreader interface. The circuit board component further includes a die coupled to the die interface. The die includes integrated circuitry which is configured to electrically communicate with a circuit board when the circuit board couples to the circuit board interface. The circuit board component further includes a heat spreader coupled to the heat spreader interface. The heat spreader is configured to dissipate heat from the die. The heat spreader, in combination with the heat spreader interface, forms an electromagnetic interference shield when a portion of the circuit board interface connects to a ground reference of the circuit board through the circuit board interface.

Since (i) EMI shielding is accomplished by the heat spreader interface of the substrate and by the heat spreader and (ii) grounding of the heat spreader interface is accomplished by the component itself (i.e., through the circuit board interface), there is no need for any external metallic clips. Moreover, such EMI shielding is capable of being implemented in low cost packaging applications as well as with emerging materials since formation of such EMI shielding leverages off of standard industry techniques.

In one arrangement, the heat spreader interface includes a conductive ground plane disposed along a flat surface of the substrate. The conductive ground plane completely encircles the die interface contiguously in a 360 degree manner to minimize escape of electromagnetic interface from the die during operation of the integrated circuitry. Since the conductive ground plane fully surrounds the die interface, there is thorough and robust EMI shielding of the die.

In another arrangement, the heat spreader interface includes conductive ground plates disposed along a flat surface of the substrate. The conductive ground plates encircle the die interface in a 360 degree manner to minimize escape of electromagnetic interface from the die during operation of the integrated circuitry. This arrangement provides EMI shielding in all directions around the die (i.e., 360 degrees) as well as enables traces (e.g., signal traces) to reside along the surface of the substrate.

BRIEF DESCRIPTION OF THE DRAWINGS

The foregoing and other objects, features and advantages of the invention will be apparent from the following description of particular embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION

Embodiments of the invention are directed to electromagnetic interference (EMI) shielding techniques which utilize conductive material which is disposed around a circuit board component die but within the component itself. Such conductive material in combination with a heat spreader of the component is capable of forming an EMI shield internally within the component itself when connected to a ground reference of a circuit board through a circuit board interface of the component to block EMI which radiates from the die during operation. Accordingly, there is no need for external metallic clips to ground a heat sink and the heat spreader as in conventional EMI barrier approaches. Rather, the circuit board space around the device, which would otherwise be used by the metallic clips, is now available for use by other circuit board structures (e.g., signal traces, other circuit board components, etc.).

Figure 1:
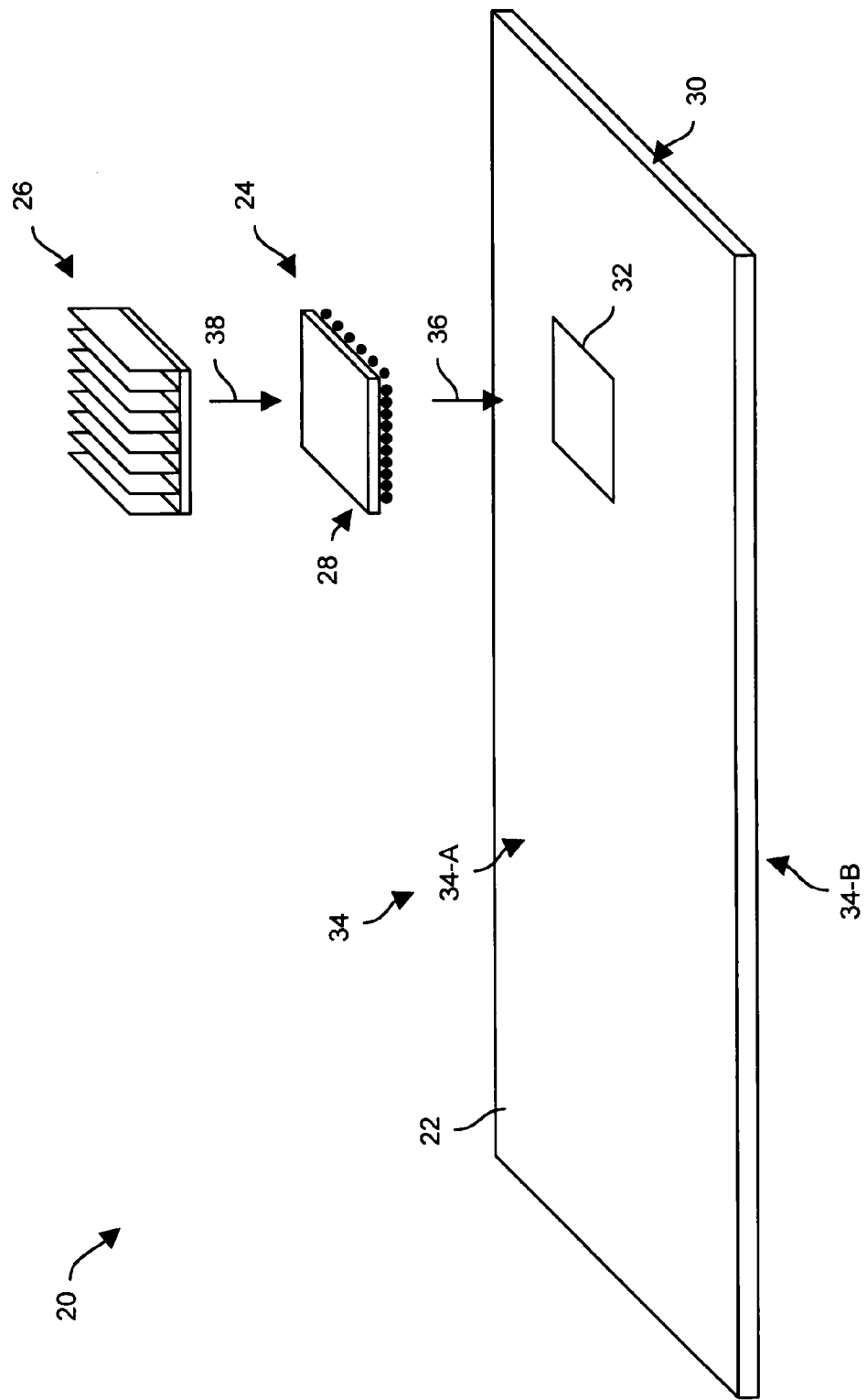
FIG. 1 is an exploded view of a circuit board module which is suitable for use by the invention.

FIG. 1 shows an exploded view of a circuit board module (or motherboard) 20 which is suitable for use by the invention. The circuit board module 20 includes a circuit board 22, a circuit board component 24 and a heat sink 26. As will be explained in further detail below, the circuit board component 24 includes conductive material 28 (e.g., a contiguous conductive plane of material, distributed conductive plates, etc. shown generally by the arrow 28) which, when electrically connected to a ground reference 30 of the circuit board 22 (e.g., a set of ground planes shown generally by the arrow 30), operates as an EMI shield that substantially blocks escape of EMI from circuitry within the component 24. Use of the conductive material 28 alleviates the need for conventional external metallic clips thus freeing up circuit board space in the vicinity of a mounting location 32 for the component 24.

It should be understood that the circuit board component 24 is shown as a Ball Grid Array (BGA) device by way of example only, and that the component 24 is capable of having other package configurations (e.g., Ceramic Column Grid Array, Multi-Chip Module, flip chip, lead frame, etc.). Additionally, only one circuit board device (i.e., the component 24) is shown in FIG. 1 for simplicity. Nevertheless, it should be understood that the circuit board module 20 is capable of supporting numerous additional devices (e.g., other integrated circuit devices, circuit board connectors, discreet components, etc.).

As shown in FIG. 1, the circuit board 22 is substantially plane-shaped and provides a top side 34-A and a bottom side 34-B (collectively, sides 34) for supporting circuit board devices. The planar shape of the circuit board 22 makes the circuit board assembly 20 well suited for a variety of applications such as in a motherboard configuration (e.g., supporting one or more daughter cards), a daughter card configuration (e.g., attaching to a motherboard), and in high density configurations (e.g., inserting into a housing or card cage with other similar circuit board modules).

To assemble the circuit board assembly 20, a circuit board manufacturer moves the circuit board component 24 in the direction 36 and mounts the circuit board component 24 to the component mounting location 32 (e.g., using a Surface Mount Technology soldering process). The manufacturer then moves the heat sink 26 in the direction 38 and attaches the heat sink 26 to the circuit board component 24 (e.g., using an adhesive with high thermal transfer characteristics to enable the heat sink 26 to subsequently cool the component 24 when in operation). Further details of the invention will now be provided with reference to FIG. 2.

Figure 2:
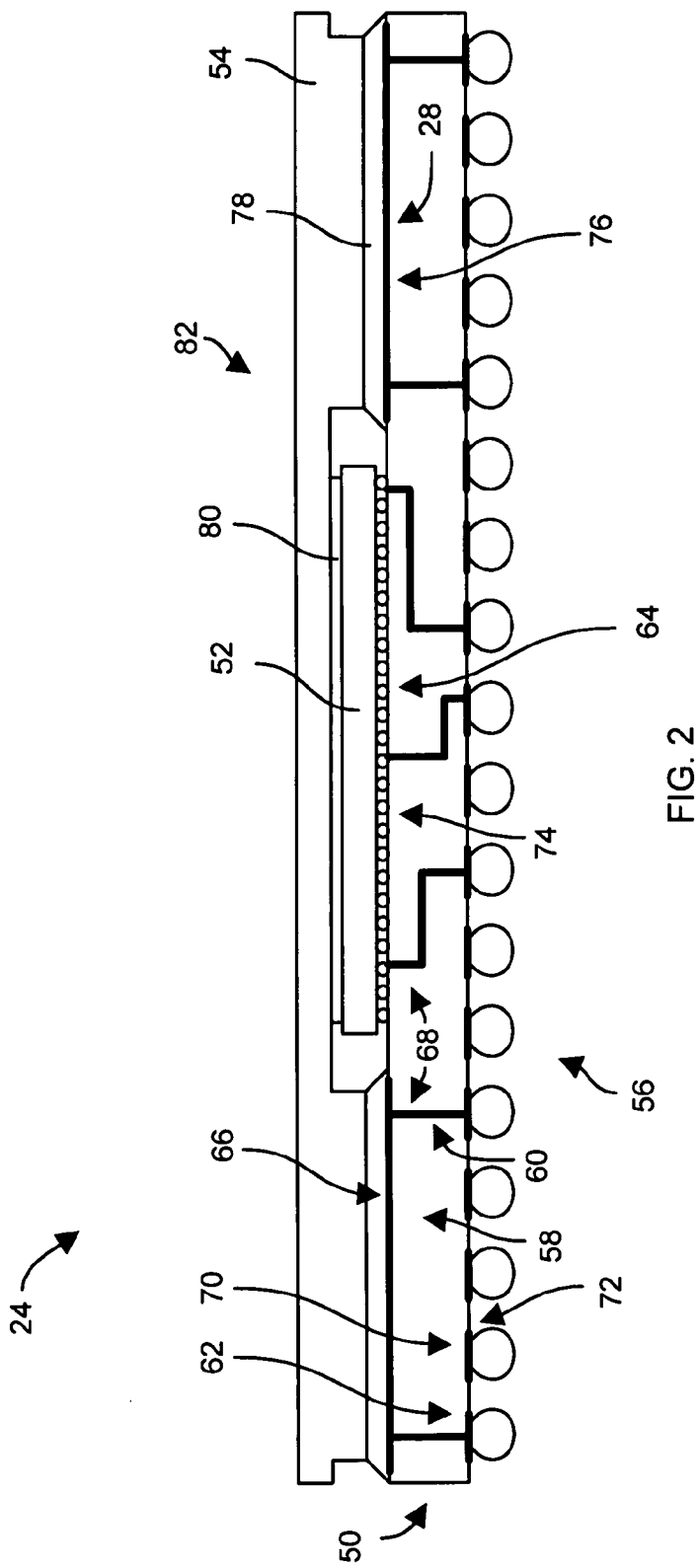
FIG. 2 is a cross-sectional side view of a circuit board component of the circuit board module of FIG. 1.

FIG. 2 is a cross-sectional side view of the circuit board component 24. As shown, the circuit board component 24 includes a substrate 50, a die 52 (e.g., a silicon-based chip), a heat spreader (or lid) 54, and a set of circuit board contacts 56 (e.g., an array of solder balls, columns, bumps, etc.). The substrate 50 operates as a supporting structure which holds the die 52, the heat spreader 54 and the circuit board contacts 56 in place. The heat spreader 54 includes thermally conductive material (e.g., copper, nickel, palladium, etc.) which conveys heat from the die 52 to the heat sink 26 (FIG. 1) and the surrounding environment.

The substrate 50 is generally planar in shape and includes layers of non-conductive material 58 (e.g., organic material, ceramic material, etc.) and conductive material 60 (e.g., copper) which are sandwiched together. The conductive material 60, which is supported by the non-conductive material 58, defines a variety of conductive structures including a circuit board interface 62, a die interface 64, a heat spreader interface 66, and a set of connections 68 (e.g., signal traces, cut-through vias, embedded conductive planes, etc.). The circuit board interface 62 is an array of pads 70 which is disposed along a flat bottom surface 72 of the substrate 50, and which connects to the set of circuit board contacts 56. Similarly, the die interface 64 is an array of pads 74 which is disposed along a flat top surface 76 of the substrate 50, and which connects to corresponding metallic contacts of the die 52. The heat spreader interface 66 includes the earlier-mentioned conductive material 28 (e.g., copper with nickel plating) which is also disposed along the flat top surface 76 of the substrate 50, and which is configured to electrically connect to the ground reference 30 of the circuit board 22 when the component 24 mounts to the component mounting location 32 (also see FIG. 1). In one arrangement, solder mask is applied to cover any exposed areas remaining on the top surface 76 of the substrate 50 for protective purposes.

As shown in FIG. 2, the connections 68 interconnect with the circuit board interface 62, the die interface 64 and the heat spreader interface 66. In particular, some connections 68 (e.g., signal traces, cut-through vias, etc.) connect the die interface 64 with the circuit board interface 62. Additionally, other connections 68 connect the heat spreader interface 66 with the circuit board interface 62 thus enabling the heat spreader interface 66 (as well as the heat spreader 54) to connect directly to the ground reference 30 of the circuit board 22 without the need of any external metallic clips. As a result, when the circuit board component 24 mounts to the mounting location 32 of the circuit board 22, the heat spreader interface 66 couples with the ground reference 30 of the circuit board 22, and the die 52 couples with power supply conductors (e.g., power supply planes and ground planes) and signal traces of the circuit board 22.

As further shown in FIG. 2, conductive materials 78 such as solder (e.g., a relatively large solder joint) connects the heat spreader 54 with the metallic conductive material 28 of the heat spreader interface 66 thus mechanically holding the heat spreader 54 in place relative to the substrate 50. Furthermore, thermally conductive but electrically non-conductive material 80 (e.g., thermal grease) resides between the die 52 and the heat spreader 54. Accordingly, during component operation, the heat spreader 54 is well-suited for simultaneously conveys heat away from the die 52 and blocks EMI radiating from the die 52.

It should be understood that the packaging design of the component 24 lends itself well to lowering EMI shielding costs as well as maintaining high interconnection reliability. That is, the packaging design is optimized because the heat spreader 54 is a multi-functional. In particular, the heat spreader 54 acts as a thermal conduit between the die 52 and the heat sink 26 (FIG. 1) due to the presence of the thermally conductive material 80 disposed between the heat spreader 54 and the die 52. Additionally, the heat spreader 54, in combination with the conductive material 28 and the conductive materials 78, acts as an EMI shield 82 due to grounding of the heat spreader interface 66 to the ground reference 30. Thus, there is no need for any external metallic clips to ground the heat sink 26 and the heat spreader 54 and the heat sink 26 is capable of mounting to the heat spreader 54 with simple thermal adhesive. Further details of the invention will now be provided with reference to FIG. 3.

Figure 3:
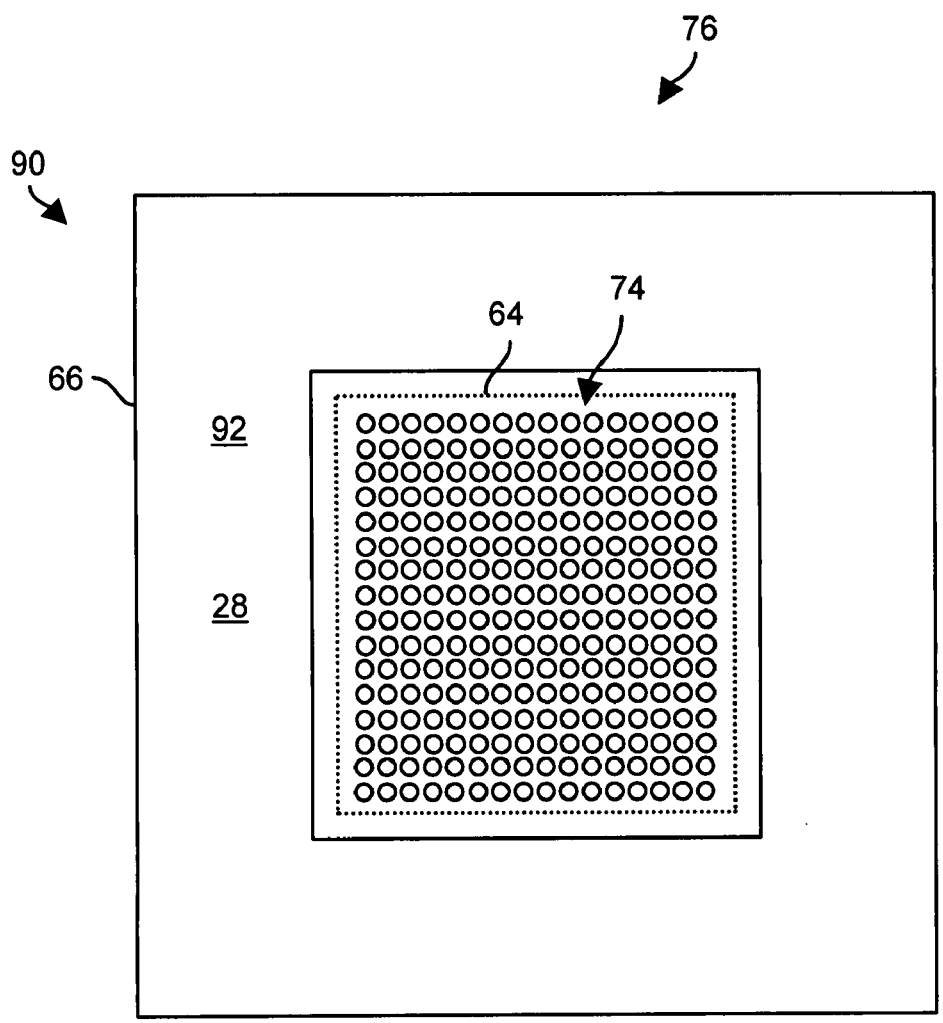
FIG. 3 is a top view of a layout for a heat spreader interface of the circuit board component of FIG. 2.

FIG. 3 shows a top view of a layout 90 which is suitable for use by the heat spreader interface 66. In accordance with the layout 90, the heat spreader interface 66 takes the form of a conductive ground plane 92 having the conductive material 28 (also see FIG. 1). The conductive ground plane 92 is disposed along the flat top surface 76 of the substrate 50 (also see FIG. 2) and completely encircles the die interface 64 in a 360 degree contiguous manner. It should be understood that a variety of shapes are suitable for conductive ground plane 92 as long as a contiguous electrical path is preferably formed.

As mentioned earlier, the conductive material 28 of the heat spreader interface 66 connects to the ground reference 30 of the circuit board 22 through the connections 68 (e.g., ground traces, vias, etc.), the contacts 56 and the component mounting location 32 of the circuit board 22. Such grounding prevents the heat spreader 54 from floating and from operating as an antenna. Rather, the heat spreader interface 66 and the heat spreader 54 operate as an EMI barrier which minimizes escape of EMI from the die 52 during operation of integrated circuitry within the die 52. In particular, since the conductive ground plane 92 fully surrounds the die interface 64, there is thorough and robust EMI shielding of the die 52. Further details of the invention will now be provided with reference to FIG. 4.

Figure 4:
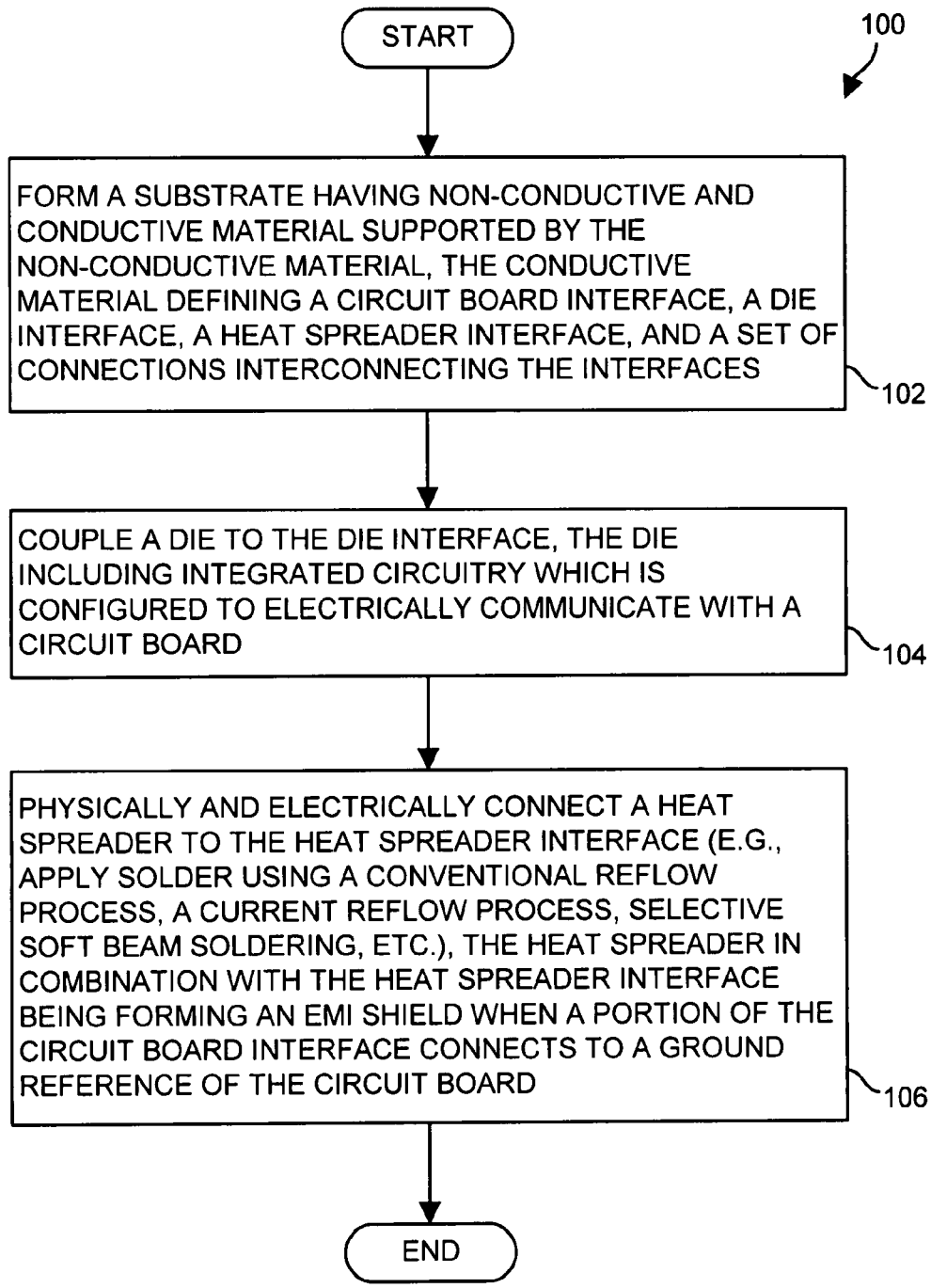
FIG. 4 is a flowchart of a procedure which is suitable for use in manufacturing the circuit board component of the circuit board module.

FIG. 4 shows a procedure 100 which is performed by a manufacturer when manufacturing the circuit board component 24. In step 102, the manufacturer forms the substrate 50 having the non-conductive material 58 and conductive material 60 supported by the non-conductive material 58. As mentioned earlier and as shown in FIG. 2, the conductive material 60 defines (i) the circuit board interface 62, (ii) the die interface 64, (iii) the heat spreader interface 66, and (iv) the set of connections 68 which interconnects the circuit board interface 62, the die interface 64 and the heat spreader interface 66.

In step 104, the manufacturer couples the die 52 to the die interface 64. The die 52 includes integrated circuitry which is configured to electrically communicate with the circuit board 22 when the circuit board 22 couples to the circuit board interface 62, i.e., when the component 24 mounts to the component mounting location 32 of the circuit board 22 (FIG. 1).

In step 106, the manufacturer physically and electrically connects the heat spreader 54 to the heat spreader interface 66 defined by the conductive material 60 of the substrate 50 (FIG. 2). As mentioned earlier, the heat spreader 54 is configured to dissipate heat from the die 52. Additionally, the heat spreader 54 in combination with the heat spreader interface 66 forms the EMI shield 82 when a portion of the circuit board interface 62 connects to the ground reference 30 of the circuit board 22. Accordingly, the heat spreader interface 66 and the heat spreader 54 perform the dual role of thermal management and EMI control.

It should be understood that a variety of soldering processes are suitable for use when physically and electrically connecting the heat spreader 54 to the heat spreader interface 66 in step 106. In one arrangement, the manufacturer utilizes a conventional reflow soldering process by printing solder paste over the heat spreader interface 66 (e.g., using a stencil). The solder paste includes flux and high temperature solder (e.g., high-lead solder) to prevent secondary reflow during assembly of the circuit board module 20. The manufacturer then places the heat spreader 54 in contact with the solder paste (e.g. using automated pick and place equipment), and applies heat (e.g., by passing the device through an oven) to activate the flux and melt the high temperature solder to form a robust solder joint (i.e., the conductive materials 78) between the heat spreader 54 and the heat spreader interface 66 (also see FIG. 2).

In another arrangement, the manufacturer utilizes a current heating reflow process to form the solder joint 78. In particular, the manufacturer prints solder paste over the heat spreader interface 66, and places the heat spreader 54 in contact with the solder paste. The manufacturer then applies current through the heat spreader interface 66 and the heat spreader 54 to activate the flux and melt the high temperature solder to form the solder joint 78.

In yet another arrangement, the manufacturer utilizes a selective soft beam process to form the solder joint 78. In particular, as in the earlier-described arrangements, the manufacturer prints solder paste over the heat spreader interface 66, and places the heat spreader 54 in contact with the solder paste. Next, the manufacturer directs a laser over the solder paste to activate the flux and melt the high temperature solder to form the solder joint 78.

In all of the above-described arrangements, the solder joint 78 is robustly and reliable formed between the heat spreader interface 66 and the heat spreader 54. The use of high temperature solder (e.g., high-lead rather than regular eutectic solder) prevents the solder from re-melting during assembly of the circuit board module 20. Of course, other fastening mechanisms are suitable for use as well (e.g., conductive adhesives, etc.). Further details of the invention will now be provided with reference to FIG. 5.

Figure 5:
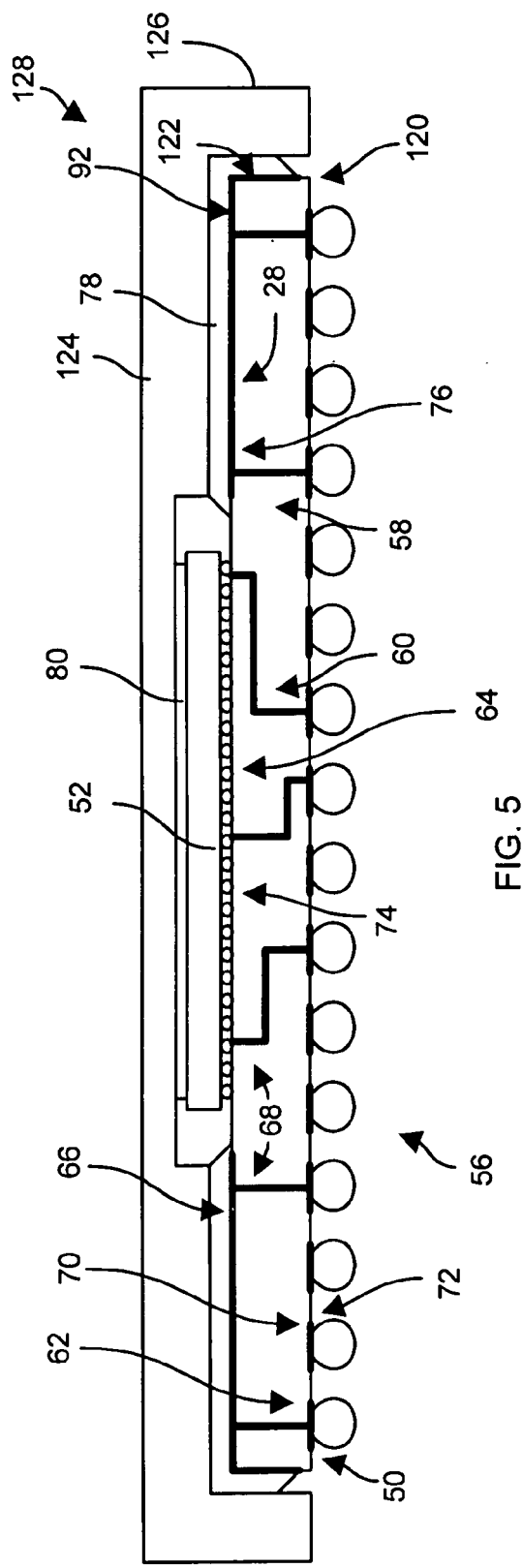
FIG. 5 is an alternative cross-sectional side view of the circuit board component of the circuit board module of FIG. 1.

FIG. 5 is an alternative cross-sectional side view of the circuit board component 24. The configuration of FIG. 5 is similar to that of FIG. 2. However, in contrast to FIG. 2, the conductive material 60 of the substrate 50 in FIG. 5 extends along an outer periphery 120 of the substrate 50. That is, a conductive ground edge portion 122 of the heat spreader interface 66 overhangs an outer edge of the non-conductive material 58 of the substrate 50 along the outer periphery 120.

As shown in FIG. 5, the conductive ground edge portion 122 is contiguous with a main portion of the heat spreader interface 66, i.e., the conductive ground plane 92 (also see FIG. 3), and extends in a substantially perpendicular manner relative to the conductive ground plane 92 thus providing the heat spreader interface 66 with an L-shaped cross-section. Similarly, the heat spreader 54 has a central portion 124 which extends along the conductive ground plane 92 in a substantially parallel manner, and a overhanging portion 126 which extends along the conductive ground edge 122 in a substantially parallel manner. As a result, during soldering, the solder joint 78 wets to both horizontally and vertically to form a solder joint with an L-shaped cross-section as well.

The conductive ground edge portion 122 of the heat spreader interface 66, the solder joint 78 and the overhanging portion 126 of the heat spreader 54 operate to block EMI radiating from the substrate 50. Accordingly, in the configuration of FIG. 5, the heat spreader interface 66 and the heat spreader 54 forms an EMI barrier 128 for coverage of both the die 52 and the substrate 50 for improved EMI shielding. The solder 78 is electrically conductive and forms a reliable EMI seal between the heat spreader 54 and the heat spreader interface 66. Further details of the invention will now be provided with reference to FIG. 6.

Figure 6:
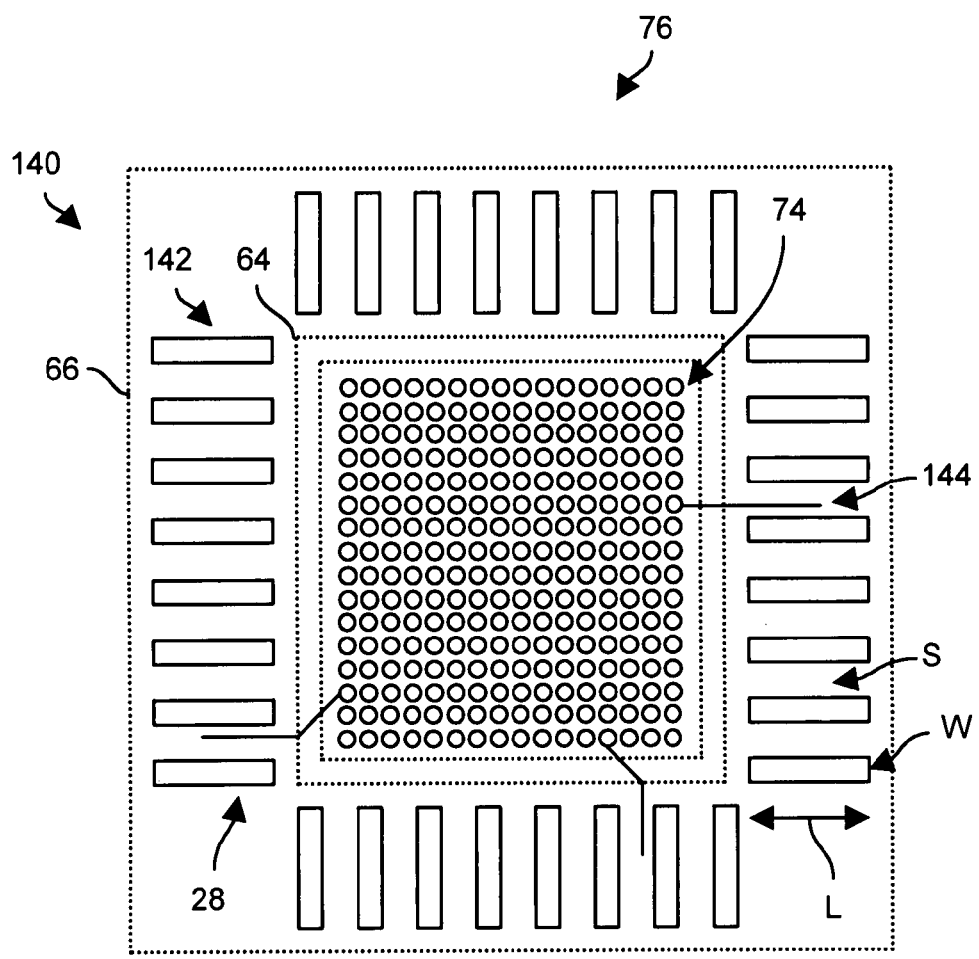
FIG. 6 is a top view of an alternative layout for the heat spreader interface of the circuit board component of FIG. 2.

FIG. 6 is a top view of an alternative layout 140 for the heat spreader interface 66. As shown in the layout 140, the heat spreader interface 66 includes conductive ground plates 142 disposed along the flat top surface 76 of the substrate 50 (also see the conductive material 28 of FIG. 1). The conductive ground plates 142 connect to the ground reference 30 of the circuit board 22 through the connections 68 (e.g., ground traces and vias) and the circuit board interface 62 (FIG. 2), and encircle the die interface 64 in a distributed 360 degree manner to minimize escape of EMI from the die 52 during operation of its integrated circuitry. Accordingly, the heat spreader interface 66 provides EMI shielding in all directions around the die 52 (i.e., 360 degrees) as well as enables traces 144 (e.g., signal traces leading to the die 52) to reside along the surface 76 of the substrate 50.

Preferably, the conductive ground plates 142 are evenly spaced around of the die interface 64 and connect, by way of solder joints 78, with the heat spreader 54 to robustly and reliably hold the heat spreader 54 in place. The EMI shielding effect provided by the heat spreader interface 66 depends, among other things, on the plate separation distance S between the plates 142, the plate length L, and height of the plates 142 and solder joints 78. EMI shielding improves as the distance S decreases. In one arrangement, the distance S is substantially less than half the length of an EM wave for reliable EMI shielding.

As explained above, embodiments of the invention are directed to EMI shielding techniques which utilize conductive material 28 which is disposed around the die 52 but within the circuit board component 24 itself. Such conductive material 28, in combination with both a heat spreader 54 of the component 24 and additional conductive material 78 (e.g., solder which joins the conductive material 28 to the heat spreader 54), is capable of forming an EMI shield internally within the component 24 itself when connected to a ground reference 30 of a circuit board 22 through the circuit board interface 62 to block EMI which radiates from the die 52 during operation. Accordingly, there is no need for external metallic clips to ground a heat sink 26 in order to make the heat sink 26 operate as an EMI shield. Furthermore, the circuit board space around the component 24, which would otherwise be used by the external metallic clips, is now available for use by other circuit board structures (e.g., signal traces, other circuit board components, etc.).

While this invention has been particularly shown and described with references to preferred embodiments thereof, it will be understood by those skilled in the art that various changes in form and details may be made therein without departing from the spirit and scope of the invention as defined by the appended claims.

What is claimed is:

1. A circuit board component, comprising:
  a substrate having non-conductive material and conductive material supported by the non-conductive material, the conductive material defining (i) a circuit board interface, (ii) a die interface, (iii) a heat spreader interface, and (iv) a set of connections which interconnects the circuit board interface, the die interface and the heat spreader interface;
  a die coupled to the die interface defined by the conductive material of the substrate, the die including integrated circuitry which is configured to electrically communicate with a circuit board when the circuit board couples to the circuit board interface defined by the conductive material of the substrate; and
  a heat spreader coupled to the heat spreader interface defined by the conductive material of the substrate, the heat spreader being configured to dissipate heat from the die, the heat spreader in combination with the heat spreader interface forming an electromagnetic interference shield when a portion of the circuit board interface connects to a ground reference of the circuit board through the circuit board interface;
  wherein the die is disposed between the heat spreader and the substrate, and
  wherein the circuit board component is an Application Specific Integrated Circuit device, and wherein the heat spreader comprises:
a primary portion extending along a flat surface of the substrate in a substantially parallel manner relative to the flat surface of the substrate;
a secondary portion extending from the primary portion toward the substrate along a direction substantially perpendicular to the flat surface of the substrate, the secondary portion electrically contacting a conductive ground plane disposed along a flat surface of the substrate; and
a conductive around edge extending from the secondary portion along a direction substantially perpendicular to the flat surface of the substrate and overhanging an outer periphery of the substrate, the conductive around edge electrically coupled to a conductive around edge portion of the heat spreader interface that extends along the outer periphery of the substrate.

2. The circuit board component of claim 1 wherein the heat spreader interface includes:
the conductive ground plane disposed along the flat surface of the substrate, the conductive ground plane completely encircling the die interface in a 360 degree manner to minimize escape of electromagnetic interference from the die during operation of the integrated circuitry.

3. The circuit board component of claim 1 wherein the heat spreader interface includes:
conductive ground plates disposed along a flat surface of the substrate, the conductive ground plates encircling the die interface in a 360 degree manner to minimize escape of electromagnetic interference from the die during operation of the integrated circuitry.

4. The circuit board component of claim 3, wherein the conductive ground plates disposed along the flat surface of the substrate define a separation distance between adjacent conductive ground plates.

5. The circuit board component of claim 4, wherein the separation distance is less than one-half a length of an electromagnetic wave.

6. The circuit board component of claim 1, further comprising:
a ring-shaped solder joint formed from high temperature solder which forms an electromagnetic interference seal between the heat spreader and the heat spreader interface defined by the conductive material of the substrate.

7. The circuit board component of claim 1 wherein the heat spreader interface is disposed along a first flat surface of the substrate, wherein the circuit board interface is disposed along a second flat surface of the substrate, wherein the first and second flat surfaces are substantially parallel to each other, wherein the circuit board interface includes an array of pads, and wherein the circuit board component further comprises:
an array of circuit board contacts coupled to the array of pads, the array of circuit board contacts being configured to mount to an area array component mounting location of the circuit board using a surface mount technology soldering process.

8. A circuit board module, comprising:
a circuit board having a component mounting location;
a circuit board component mounted to the component mounting location of the circuit board, the circuit board component including:
a heat spreader configured to dissipate heat from the circuit board component,
a substrate having non-conductive material and conductive material supported by the non-conductive material, the conductive material defining (i) a circuit board interface, (ii) a die interface, (iii) heat spreader connecting means for physically and electrically connecting to the heat spreader, and (iv) a set of connections which interconnects the circuit board interface, the die interface and the heat spreader connecting means, wherein the heat spreader and the heat spreader connecting means form an electromagnetic interference shield when a portion of the circuit board interface connects to a ground reference of the circuit board through the circuit board interface, and
a die coupled to the die interface defined by the conductive material of the substrate, the die including integrated circuitry which is configured to electrically communicate with the circuit board when the circuit board couples to the circuit board interface defined by the conductive material of the substrate; and
a heat sink in thermal communication with the heat spreader of the circuit board component;
wherein the die is disposed between the heat spreader and the substrate, and
wherein the circuit board component is an Application Specific Integrated Circuit device, and
wherein the heat spreader comprises:
a primary portion extending along a flat surface of the substrate in a substantially parallel manner relative to the flat surface of the substrate;
a secondary portion extending from the primary portion toward the substrate along a direction substantially perpendicular to the flat surface of the substrate, the secondary Portion electrically contacting a conductive ground plane disposed along a flat surface of the substrate; and
a conductive ground edge extending from the secondary portion along a direction substantially perpendicular to the flat surface of the substrate and overhanging an outer periphery of the substrate, the conductive ground edge electrically coupled to a conductive ground edge Portion of the heat spreader connecting means that extends along the outer periphery of the substrate.

9. The circuit board module of claim 8 wherein the heat spreader interface defined by the conductive material of the substrate of the circuit board component includes:
conductive ground plates disposed along a flat surface of the substrate, the conductive ground plates encircling the die interface in a 360 degree manner to minimize escape of electromagnetic interference from the die during operation of the integrated circuitry.

10. The circuit board module of claim 9, wherein the conductive ground plates disposed along the flat surface of the substrate define a separation distance between adjacent conductive ground plates.

11. A circuit board component, comprising:
a heat spreader configured to dissipate heat from the circuit board component;
a substrate having non-conductive material and conductive material supported by the non-conductive material, the conductive material defining (i) a circuit board interface, (ii) a die interface, (iii) heat spreader connecting means for physically and electrically connecting to the heat spreader, and (iv) a set of connections which interconnects the circuit board interface, the die interface and the heat spreader connecting means, wherein the heat spreader and the heat spreader connecting means form an electromagnetic interference shield when a portion of the circuit board interface connects to a ground reference of a circuit board through the circuit board interface; and a die coupled to the die interface defined by the conductive material of the substrate, the die including integrated circuitry which is configured to electrically communicate with the circuit board when the circuit board couples to the circuit board interface defined by the conductive material of the substrate;

wherein the die is disposed between the heat spreader and the substrate, and wherein the circuit board component is an Application Specific Integrated Circuit device, and wherein the heat spreader comprises:

a primary portion extending along a flat surface of the substrate in a substantially parallel manner relative to the flat surface of the substrate;

a secondary portion extending from the primary portion toward the substrate along a direction substantially perpendicular to the flat surface of the substrate, the secondary Portion electrically contacting a conductive ground plane disposed along a flat surface of the substrate; and a conductive ground edge extending from the secondary portion along a direction substantially perpendicular to the flat surface of the substrate and overhanging an outer periphery of the substrate, the conductive around edge electrically coupled to a conductive ground edge portion of the heat spreader connecting means that extends along the outer periphery of the substrate.

12. The circuit board component of claim 11 wherein the heat spreader interface defined by the conductive material of the substrate includes:

a conductive ground plane disposed along a flat surface of the substrate, the conductive ground plane completely encircling the die interface in a 360 degree manner to minimize escape of electromagnetic interference from the die during operation of the integrated circuitry.

13. The circuit board component of claim 11 wherein the heat spreader interface defined by the conductive material of the substrate includes:

conductive ground plates disposed along a flat surface of the substrate, the conductive ground plates encircling the die interface in a 360 degree manner to minimize escape of electromagnetic interference from the die during operation of the integrated circuitry.

14. The circuit board component of claim 13, wherein the conductive ground plates disposed along the flat surface of the substrate define a separation distance between adjacent conductive ground plates.

15. The circuit board component of claim 14, wherein the separation distance is less than one-half a length of an electromagnetic wave.

16. A circuit board module, comprising:

a circuit board having a component mounting location;

a circuit board component mounted to the component mounting location of the circuit board, the circuit board component including:

a substrate having non-conductive material and conductive material supported by the non-conductive material, the conductive material defining (i) a circuit board interface, (ii) a die interface, (iii) a heat spreader interface, and (iv) a set of connections which interconnects the circuit board interface, the die interface and the heat spreader interface, a die coupled to the die interface defined by the conductive material of the substrate, the die including integrated circuitry which is configured to electrically communicate with the circuit board when the circuit board couples to the circuit board interface defined by the conductive material of the substrate, and a heat spreader coupled to the heat spreader interface defined by the conductive material of the substrate, the heat spreader being configured to dissipate heat from the die, the heat spreader in combination with the heat spreader interface forming an electromagnetic interference shield when a portion of the circuit board interface connects to a ground reference of the circuit board through the circuit board interface; and a heat sink in thermal communication with the heat spreader of the circuit board component;

wherein the die is disposed between the heat spreader and the substrate, and wherein the circuit board component is an Application Specific Integrated Circuit device, and wherein the heat spreader comprises:

a primary portion extending along a flat surface of the substrate in a substantially parallel manner relative to the flat surface of the substrate;

a secondary portion extending from the primary portion toward the substrate along a direction substantially perpendicular to the flat surface of the substrate, the secondary Portion electrically contacting a conductive around plane disposed along a flat surface of the substrate; and a conductive around edge extending from the secondary portion along a direction substantially perpendicular to the flat surface of the substrate and overhanging an outer periphery of the substrate, the conductive ground edge electrically coupled to a conductive ground edge portion of the heat spreader interface that extends along the outer periphery of the substrate.

17. The circuit board module of claim 16 wherein the heat spreader interface defined by the conductive material of the substrate of the circuit board component includes:

the conductive ground plane disposed along the flat surface of the substrate, the conductive ground plane completely encircling the die interface in a 360 degree manner to minimize escape of electromagnetic interference from the die during operation of the integrated circuitry.

18. The circuit board module of claim 16, wherein:

the conductive material comprises at least one conductive layer; and the non-conductive material comprises a non-conductive layer supported by the conductive layer.

19. A circuit board module, comprising:

a circuit board having a component mounting location;

a circuit board component mounted to the component mounting location of the circuit board, the circuit board component including:

a substrate having non-conductive material and conductive material supported by the non-conductive material, the conductive material defining (i) a circuit board interface, (ii) a die interface, (iii) a heat spreader interface, and (iv) a set of connections which interconnects the circuit board interface, the die interface and the heat spreader interface, a die coupled to the die interface defined by the conductive material of the substrate, the die including integrated circuitry which is configured to electrically communicate with the circuit board when the circuit board couples to the circuit board interface defined by the conductive material of the substrate, and a heat spreader coupled to the heat spreader interface defined by the conductive material of the substrate, the heat spreader being configured to dissipate heat from the die, the heat spreader in combination with the heat spreader interface forming an electromagnetic interference shield when a portion of the circuit board interface connects to a ground reference of the circuit board through the circuit board interface; and a heat sink in thermal communication with the heat spreader of the circuit board component;

wherein the die is disposed between the heat spreader and the substrate, and wherein the circuit board component is an Application Specific Integrated Circuit device, wherein the heat spreader interface defined by the conductive material of the substrate of the circuit board component includes:

conductive ground plates disposed along a flat surface of the substrate, the conductive ground plates encircling the die interface in a 360 degree manner to minimize escape of electromagnetic interference from the die during operation of the integrated circuitry, wherein the heat spreader comprises:

a primary portion extending along the flat surface of the substrate in a substantially parallel manner relative to the flat surface of the substrate; and a secondary portion extending from the primary portion toward the substrate along a direction substantially perpendicular to the flat surface of the substrate, the secondary portion electrically contacting a conductive ground plane disposed along a flat surface of the substrate, and further comprising:

a conductive ground edge extending from the secondary portion along a direction substantially perpendicular to the flat surface of the substrate and overhanging an outer periphery of the substrate, the conductive ground edge electrically coupled to a conductive ground edge portion of the heat spreader interface that extends along the outer periphery of the substrate.

20. The circuit board module of claim 19, wherein the conductive ground plates disposed along the flat surface of the substrate define a separation distance between adjacent conductive ground plates.

21. The circuit board module of claim 20, wherein the separation distance is less than one-half a length of an electromagnetic wave.

* * * * *